Oct. 24, 1950 J. E. TRAUGOTT ET AL 2,526,834

RADIO RECEIVER EMPLOYING PLUG-IN COMPONENTS

Filed May 2, 1947 2 Sheets-Sheet 1

INVENTORS
BOB B. DE LIBERO, AND
JOHN E. TRAUGOTT,
BY
McMorrow, Berman & Davidson
ATTORNEYS.

RADIO RECEIVER EMPLOYING PLUG-IN COMPONENTS

Filed May 2, 1947 2 Sheets-Sheet 2

INVENTORS
BOB B. DE LIBERO, AND
BY JOHN E. TRAUGOTT,

McMorrow, Berman & Davidson
ATTORNEYS.

Patented Oct. 24, 1950

2,526,834

UNITED STATES PATENT OFFICE 2,526,834

RADIO RECEIVER EMPLOYING PLUG-IN COMPONENTS

John E. Traugott and Bob B. De Libero, New York, N. Y.

Application May 2, 1947, Serial No. 745,384

2 Claims. (Cl. 250—16)

This invention relates to radio receivers, and more particularly to radio receivers of the type employing plug-in component stages elements.

A main object of the invention is to provide a novel and improved radio receiver which is very simple in construction, efficient in operation and very easy to repair.

A further object of the invention is to provide an improved radio receiver structure in which the process of manufacture is greatly simplified, the performance of the receiver is improved, wiring of the receiver is facilitated, and the receiver chassis is made very compact.

A still further object of the invention is to provide an improved radio receiver wherein none of the component parts are mounted underneath the chassis, the component stage elements are assembled in convenient units which are separately shielded and easy to install or to remove for servicing and wherein the component parts are shockproof and substantially moisture-proof.

Further objects and advantages of the invention will become apparent from the following description and claims, and from the accompanying drawings, wherein:

Figure 1:
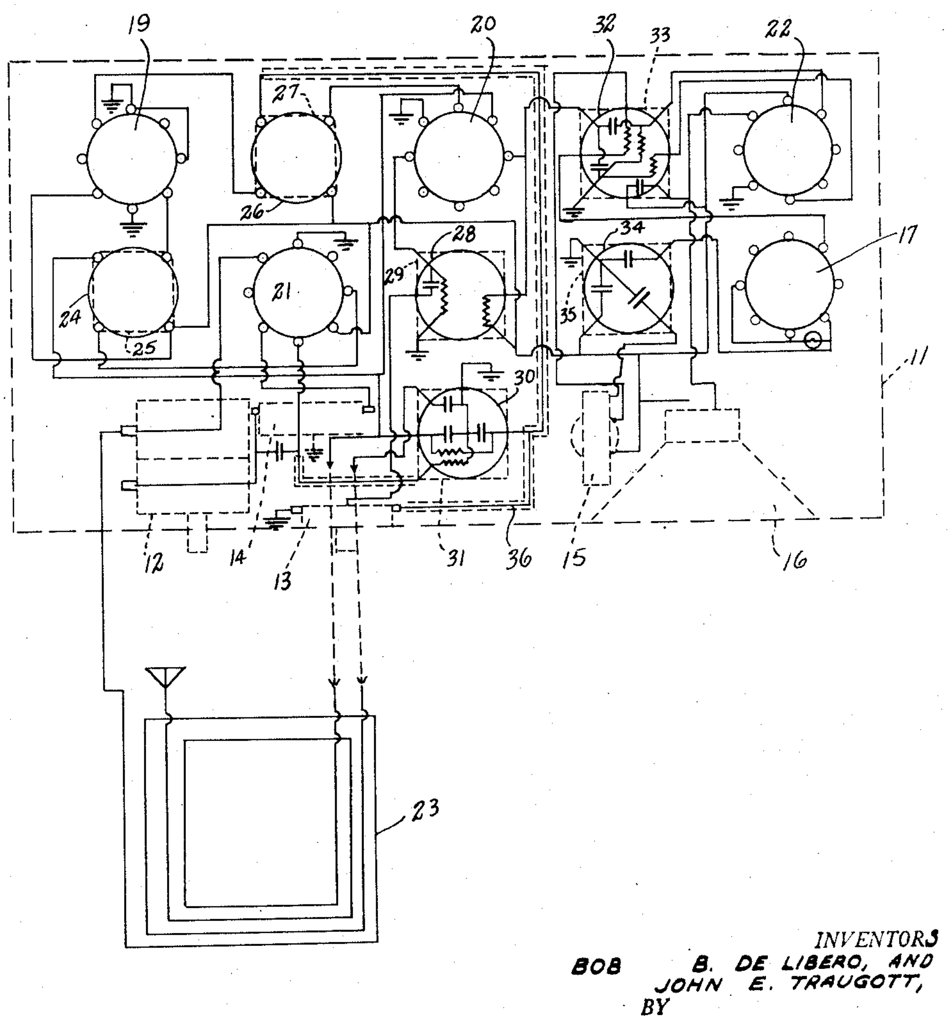
Figure 1 is a schematic diagram of a radio receiver constructed in accordance with the present invention.
Figure 2:
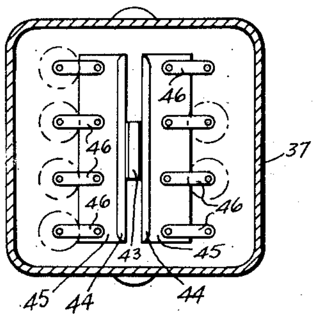
Figure 2 is a horizontal cross-sectional view taken through a plug-in stage unit employed in the radio receiver of Figure 1.
Figure 3:
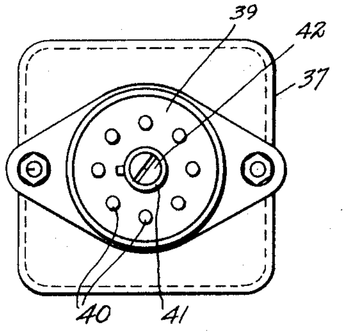
Figure 3 is a bottom view of the plug-in stage unit of Figure 2.
Figure 4:
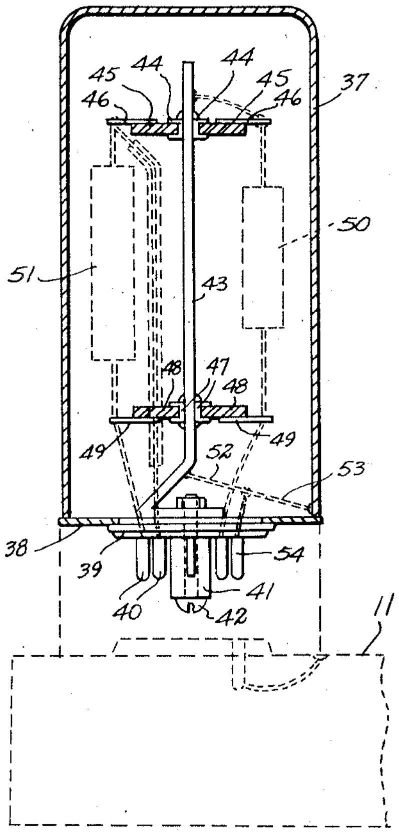
Figure 4 is a vertical cross-sectional view of the plug-in stage unit of Figure 2.
Figure 5:
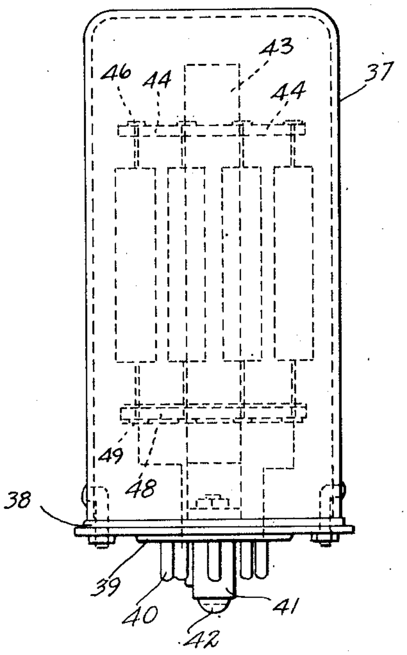
Figure 5 is a side elevational view of the plug-in stage unit of Figure 2.

Referring to the drawings, 11 designates a receiver chassis, the receiver being for purposes merely of illustration, of the conventional table model, series-filament superheterodyne type now in common use. The chassis 11 has mounted thereon a tuning condenser unit 12, a volume control 13, an oscillator coil 14, a choke unit 15 and a speaker unit 16, all secured to the chassis in a conventional manner. Also secured to the chassis and viewed from beneath said chassis in Figure 1 are a conventional rectifier tube socket 17, converter tube socket 19, a second detector tube socket 20, an intermediate frequency amplifier tube socket 21, and an output tube socket 22, of the conventional octal type. A conventional antenna 23 of the loop type is also provided.

Adjacent the socket 19 is secured a socket 24 for a plug-in first intermediate frequency transformer 25. Adjacent socket 21 is secured a socket 26 for a plug-in second intermediate frequency transformer 27. Adjacent the second detector socket 20 is secured a socket 28 for receiving a plug-in unit 29 containing the condensers and resistors for the intermediate frequency stages and adjacent said socket 28 is another socket 30 for receiving a plug-in unit 31 containing the condensers and resistors of the radio frequency portion of the receiver. Between sockets 20 and 22 is secured a socket 32 for receiving a plug-in unit 33 containing the condensers and resistors for the audio frequency portion of the receiver. Adjacent rectifier socket 17 is secured a socket 34 for receiving a plug-in unit 35 containing the filter condensers of the receiver.

The internal connections of the respective plug-in units and the connections of their sockets with the remaining parts of the receiver are such that when the units are plugged into their sockets the conventional receiver hook-up is obtained. However, it will be noted that all of the small parts most frequently subject to failure, such as condensers and resistors are contained in the plug-in units, and none of said small parts are mounted directly on the chassis 11. This minimizes the amount of wiring under the chassis and allows all connections thereunder to be very short. The volume control lead wire 36 and such other wires which may pick up undesirable electrical disturbances are preferably shielded by suitable metallic tubing grounded to the receiver chassis, in accordance with conventional practice.

The sockets for the respective plug-in units may be of any conventional type, and are preferably of the octal type. The plug-in units shown in detail in Figures 2 to 5, each comprises a metal housing 37 having an apertured base portion 38 to which is secured a male multiple plug member 39 having depending contact prongs 40 and a depending central pilot lug 41, as in the conventional octal plug. The body of the plug member 39 is of insulating material. A vertical bore is formed through lug 41 and secured to the body of the plug member by a bolt 42 passing through said bore is an upstanding post member 43 of stiff metal bar stock or the like. Secured transversely to the upper portion of post member 43 are opposed channel strips 44, 44 in which are secured respective insulating strips 45, 45. Each insulating strip 45 carries a plurality of outwardly projecting terminal lugs 46. Secured transversely to the lower portion of post member 43 are opposed channel strips 47, 47 in which are secured respective insulating strips 48, 48. Each insulating strip 48 carries a plurality of outwardly projecting terminal lugs 49, similar to and vertically aligned with the upper terminal lugs 46. The resistor units, such as shown at 50 or condenser units, such as shown at 51 are mounted in vertical positions and their terminal wires are connected to opposed pairs of terminal lugs 46 and 49. The other required connections between the units are made inside the housing 37 and the resultant terminal wires for connection to the external parts of the receiver are connected to the respective plug prongs 40. The central post member 43 and the housing 37 are connected by wires 52 and 53 to one of the prongs 54. Prong 54 engages a grounded socket receptacle when the unit is plugged into its socket.

By mounting the condensers and resistors of each individual stage of the receiver in a separate plug-in unit, individual checking of the condensers and resistors of the respective stages to locate a defective or inoperative component is greatly facilitated, since the plug-in unit may be readily removed and no unsoldering of the receiver connections is required to obtain electrical access to the various components. Each plug-in unit can be manufactured separately and wired separately in a standardized manner, thereby simplifying the wiring of the receiver chassis in production. Since no component parts are mounted beneath the chassis, wiring of the chassis is simplified and mistakes in wiring are minimized. Since no space is required under the chassis for components, the chassis may be made very compact. Since each plug-in unit is separately enclosed and shielded the parts therein are protected against dust and moisture and cannot become readily displaced.

While a specific embodiment of a radio receiver has been disclosed in connection with the present invention, the invention may be employed in various other well-known receiver types and is not limited to receivers of the table model superheterodyne type herein disclosed. It is further understood that various other modifications within the spirit of the invention may occur to those skilled in the art. Therefore, it is intended that no limitations be placed on the invention other than as defined by the scope of the appended claims.

What is claimed is:

1. In a radio receiver, a plug-in unit adapted to receive certain of the components of the receiver, said unit comprising a base, a multi-pronged male plug secured to said base and having its prongs depending therefrom, a central post member secured to said plug and projecting upwardly therefrom, a first pair of opposed channel strips transversely secured to the upper portion of said post member, a second pair of opposed channel strips transversely secured to said post member below the first pair, an insulating strip secured to each channel strip, a plurality of terminal lugs carried by each insulating strip, and a housing surrounding the post member and the parts carried thereby, said housing being secured at its bottom portion to said base.

2. In a radio receiver, a plug-in unit adapted to receive the condensers and resistors of at least one stage of the receiver, said unit comprising a base, a multi-pronged male plug secured to said base and having its prongs depending therefrom, a central post member secured to said plug and projecting vertically upwardly therefrom, a first pair of opposed channel strips transversely secured to the upper portion of said post member, a second pair of opposed channel strips transversely secured to the lower portion of said post member in vertical alignment with the respective channel strips of said first pair, an insulating strip secured in each channel strip, a plurality of terminal lugs secured on each insulating strip, the respective upper terminal lugs being vertically aligned with the respective lower terminal lugs, and a housing surrounding the post member and the parts carried thereby, said housing being secured at its bottom portion to said base.

JOHN E. TRAUGOTT.
BOB B. DE LIBERO.

REFERENCES CITED

The following references are of record in the file of this patent:

UNITED STATES PATENTS

| Number | Name | Date |
|---|---|---|
| 1,737,278 | Van Der Pol | Nov. 26, 1937 |
| 2,268,619 | Reid | Jan. 6, 1942 |
| 2,421,676 | Beard | June 3, 1947 |

FOREIGN PATENTS

| Number | Country | Date |
|---|---|---|
| 317,574 | Great Britain | Aug. 22, 1929 |
| 671,156 | France | Dec. 10, 1929 |
| 689,401 | France | Sept. 5, 1930 |
| 807,990 | France | Jan. 26, 1937 |